United States Patent
Lee et al.

(10) Patent No.: US 12,532,688 B2
(45) Date of Patent: Jan. 20, 2026

(54) SUPPORTING DEVICE AND APPARATUS FOR PROCESSING A SUBSTRATE INCLUDING A SUPPORTING DEVICE

(71) Applicant: Semes Co., Ltd., Cheonan-si (KR)

(72) Inventors: Yonghee Lee, Cheonan-si (KR); Sangmin Lee, Seoul (KR); Euisang Lim, Cheonan-si (KR); Dohyeon Yoon, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 28 days.

(21) Appl. No.: 17/377,666

(22) Filed: Jul. 16, 2021

(65) Prior Publication Data
US 2022/0208561 A1    Jun. 30, 2022

(30) Foreign Application Priority Data

Dec. 30, 2020    (KR) .................. 10-2020-0187301

(51) Int. Cl.
*H01L 21/67*    (2006.01)

(52) U.S. Cl.
CPC .............. *H01L 21/67017* (2013.01)

(58) Field of Classification Search
CPC ................................ H01L 21/67017
See application file for complete search history.

(56) References Cited

U.S. PATENT DOCUMENTS

| | | | | |
|---|---|---|---|---|
| 6,619,304 B2 * | 9/2003 | Worm | ............... | H01L 21/68792 310/46 |
| 2003/0098127 A1 * | 5/2003 | Nakano | ............. | H01J 37/32183 156/345.47 |
| 2006/0130966 A1 * | 6/2006 | Babic | ............... | H01L 21/02101 156/345.1 |
| 2006/0225772 A1 | 10/2006 | Jones | | |
| 2006/0255012 A1 * | 11/2006 | Jacobson | .......... | H01L 21/67069 216/83 |
| 2008/0063493 A1 * | 3/2008 | Cho | .................. | H01L 21/67034 414/217 |
| 2013/0081658 A1 * | 4/2013 | Song | ................ | H01L 21/67051 134/25.1 |

(Continued)

FOREIGN PATENT DOCUMENTS

| JP | 2008/072118 A | 3/2008 |
|---|---|---|
| KR | 2005-0074639 | 7/2005 |

(Continued)

OTHER PUBLICATIONS

Japanese Notice of Reasons for Refusal (with Machine English Translation from Espacenet.com) dated Sep. 5, 2022 for Japanese Application No. 2021-125727; 10 Pages.

*Primary Examiner* — Keath T Chen
*Assistant Examiner* — Margaret Klunk
(74) *Attorney, Agent, or Firm* — DALY, CROWLEY, MOFFORD & DURKEE, LLP

(57) ABSTRACT

An apparatus for processing a substrate may include a process chamber providing a processing space in which a predetermined process may be performed on the substrate, and a supporting device contacting the process chamber and supporting the process chamber. The supporting device may include a supporting chamber providing a supporting space for supporting components of the process chamber and a supply member supplying a fluid into the supporting space.

15 Claims, 3 Drawing Sheets

(56) References Cited

U.S. PATENT DOCUMENTS

| | | | | |
|---|---|---|---|---|
| 2014/0262024 A1* | 9/2014 | Cho | ............... | H01L 21/67017 |
| | | | | 156/345.1 |
| 2017/0008040 A1* | 1/2017 | Jeong | ............... | H01L 21/67017 |
| 2018/0102263 A1* | 4/2018 | Kim | ............... | H01L 21/67028 |
| 2018/0366349 A1* | 12/2018 | Cho | ............... | H01L 21/67178 |
| 2019/0148137 A1* | 5/2019 | Chang | ............... | H01L 21/67023 |
| | | | | 134/1.3 |
| 2020/0211826 A1* | 7/2020 | Fujii | ............... | H01L 21/67109 |
| 2020/0350183 A1* | 11/2020 | Liang | ............... | H01L 21/67069 |

FOREIGN PATENT DOCUMENTS

| | | |
|---|---|---|
| KR | 2008-0023854 | 3/2008 |
| KR | 10-2017-0039320 A | 4/2017 |
| KR | 10-1853377 B1 | 6/2018 |
| KR | 2019-0060687 | 6/2019 |
| TW | 201731598 A | 9/2017 |

* cited by examiner

SUPPORTING DEVICE AND APPARATUS FOR PROCESSING A SUBSTRATE INCLUDING A SUPPORTING DEVICE

CROSS-REFERENCE TO RELATED APPLICATION

This application claims priority to Korean Patent Application No. 10-2020-0187301 filed on Dec. 30, 2020 in the Korean Intellectual Property Office (KIPO), the contents of which are herein incorporated by reference in its entirety.

BACKGROUND

1. Field

Example embodiments of the invention relate to a supporting device and an apparatus for processing a substrate including a supporting device. More particularly, example embodiments of the invention relate to a supporting device which can enable a process chamber to have an improved stability and an enhanced durability, and an apparatus for processing a substrate including such a supporting device.

2. Related Technology

Generally, an integrated circuit device including a semiconductor device, or a display device including a flat panel display device can be manufactured using an apparatus for processing a substrate which can include various process chambers such as a deposition chamber, a sputtering chamber, an etching chamber, a cleaning chamber, a drying chamber, etc.

When a fluid in a supercritical state is introduced into the process chamber, the components of the process chamber may be deformed, or may be damaged by the high pressure generated from the fluid in the supercritical state. As a result, the structural stability and the durability of the process chamber may be reduced by the fluid of the supercritical state generating the high pressure. Further, the stabilities of the processes performed on a substrate loaded in the process chamber may be deteriorated.

SUMMARY

It is one aspect of the invention to provide a supporting device capable of improving structural stability of a process chamber and enhancing durability of the process chamber.

It is another aspect of the invention to provide an apparatus for processing a substrate including a supporting device capable of improving structural stability of a process chamber and enhancing durability of the process chamber.

According to one aspect of the invention, there is provided a supporting device for a process chamber performing a predetermined process on a substrate. The supporting device may include a supporting chamber disposed to be adjacent to the process chamber and a supply member for supplying a fluid into the supporting chamber.

In example embodiments, the supporting chamber may make contact with the process chamber.

In example embodiments, a pressure in the supporting chamber is substantially equal to or greater than a pressure in the process chamber.

In example embodiments, the fluid in a supercritical state may be supplied into the process chamber through a first supply line including branch lines and the supply member may include a second supply line providing the fluid in the supercritical state into the supporting chamber.

In example embodiments, the first supply line may include a first branch line connected to an upper portion of the process chamber and a second branch line connected to a lower portion of the process chamber.

In example embodiments, the first branch line may include a first control valve for adjusting a flow rate of the fluid in the supercritical state, the second branch line may include a second control valve for adjusting a flow rate of the fluid in the supercritical state, and the second supply line may include a third control valve for adjusting a flow rate of the fluid in the supercritical state.

In example embodiments, the second branch line may pass through the supporting chamber to be connected to the process chamber.

In example embodiments, the supporting chamber may includes a first connection port provided on a side portion thereof and a second connection port provided on an upper portion thereof.

In some example embodiments, the fluid in a supercritical stage may be provided into the process chamber through a supply line, and the supply member may include a branch line being divided from the supply line and providing the fluid in the supercritical state into the supporting chamber.

In some example embodiments, the fluid in the supercritical state may be supplied into the process chamber through a branch line divided from the supply line.

In other example embodiments, the fluid in a supercritical state may be supplied into the process chamber through a first supply line and the supply member may include a second supply line providing the fluid in the supercritical state into the supporting chamber.

In other example embodiments, the first supply line may be connected to a first inlet port provided on a side portion of the process chamber and the second supply line may be connected to a second inlet port provided on a side portion of the supporting chamber.

In still other example embodiments, the fluid in a supercritical state may be supplied into the process chamber through a supply line, and the supply member may include a branch line being divided from the supply line and providing the fluid in the supercritical state into the supporting chamber.

According to one aspect of the invention, there is provided an apparatus for processing a substrate which comprises a process chamber providing a processing space in which a predetermined process is performed on the substrate, and a supporting device contacting the process chamber and supporting the process chamber. The supporting device may include a supporting chamber providing a supporting space for supporting components of the process chamber and a supply member supplying a fluid into the supporting space.

In example embodiments, a pressure in the supporting space may be substantially equal to or greater than a pressure in the process chamber.

In example embodiments, the apparatus for processing a substrate may additionally include a first supply line including branch lines supplying the fluid in a supercritical state into the process chamber and the supply member may include a second supply line providing the fluid in the supercritical state into the supporting chamber. In this case, the first supply line may include a first branch line connected to an upper portion of the process chamber and a second branch line connected to a lower portion of the process chamber. For example, the second branch line may pass through the supporting chamber to be connected to the process chamber, and the supporting chamber may include a first connection port provided on a side portion thereof and a second connection port connected to an upper portion thereof.

In some example embodiments, the apparatus for processing a substrate may additionally include a supply line supplying the fluid in a supercritical state into the process chamber, and the supply member may include a branch line being divided from the supply line and providing the fluid in the supercritical state into the supporting chamber.

According to example embodiments of the invention, the supporting device including the supporting chamber and the supply member may effectively prevent components included in the process chamber from being deformed, damaged, or cracked by means of a high pressure generated by a fluid in a supercritical state introduced in the process chamber. Therefore, the structural stability and the durability of the process chamber may be enhanced, and the reliability of the process performed in the process chamber may be improved. As a result, while reducing the cost for manufacturing an integrated circuit device including a semiconductor device or a display device including a flat panel display device using the apparatus for processing a substrate, the integrated circuit device or the display device may have improved reliability.

BRIEF DESCRIPTION OF THE DRAWINGS

Example embodiments will be more clearly understood from the following detailed description taken in conjunction with the accompanying drawing. The following figures represent non-limiting, example embodiments as described herein.

DESCRIPTION OF EMBODIMENTS

Figure 1:
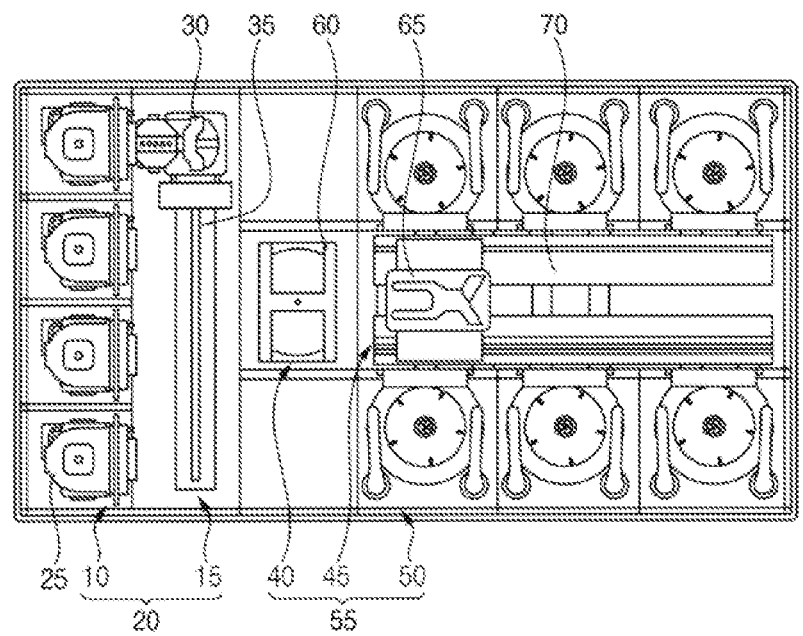
FIG. 1 is a plane view illustrating an apparatus for processing a substrate in accordance with example embodiments of the invention.

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "includes", "including", "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the invention will be described in detail with reference to the accompanying drawings. Like elements or components can be indicated by like reference numerals throughout the drawings, and the repeated explanations of like elements or components may be omitted.

FIG. 1 is a plane view illustrating an apparatus for processing a substrate in accordance with example embodiments of the invention.

Referring to FIG. 1, the apparatus for processing a substrate according to example embodiments may include an index module 20 and a processing module 55.

The index module 20 may transfer a substrate into the processing module 55 from an outside and the processing module 55 may perform predetermined processes on the substrate. Here, the substrate may be used to manufacture an integrated circuit device or a display device. For example, the substrate may include a silicon wafer, a glass substrate, an organic substrate, a ceramic substrate, etc.

In example embodiments, the index module 20 may include a road chamber 10 and a transfer frame 15. A carrier 25 capable of receiving the substrate may be loaded into the road chamber 10. For example, a front opening unified pod (FOUP) may be used as the carrier 25. The carrier 25 may be transferred from the outside into the road chamber 10, and may also be transferred from the road chamber 10 to the outside by an overhead transfer (OHT).

The transfer frame 15 may transfer the substrate between the processing module 55 and the carrier 26 loaded in the road chamber 10. The transfer frame 15 may include an index robot 30 and an index rail 35.

The index robot 30 may move along the index rail 35, and may transfer the substrate between the index module 20 and the processing module 55. For example, the index robot 30 may transfer the substrate between the carrier 25 and a buffer slot 60 while moving on the index rail 35.

As illustrated in FIG. 1, the processing module 55 may perform predetermined processes including, but not limited to, a deposition process, an etching process, a sputtering process, a coating process, a developing process, a cleaning process, and a drying process on the substrate. The processing module 55 may include a buffer chamber 40, a transfer chamber 45, the process chamber 50, a control unit (not shown), etc.

The substrate transferred between the index module 20 and the processing module 55 may stands by in the buffer chamber 40 for the predetermined processes. The buffer slot 60 on which the substrate is placed may be disposed in the buffer chamber 40. In example embodiments, a plurality of buffer slots 60 may be provided in the buffer chamber 40, and thus a plurality of substrates may be placed in the buffer chamber 40.

The transfer chamber 45 may transfer the substrate between the buffer chamber 40 and the process chamber 50. The transfer chamber 45 may include a transfer robot 65 and a transfer rail 70. The transfer robot 65 may move the transfer rail 70 and may transfer the substrate between the buffer chamber 40 and the process chamber 50. For example, the transfer robot 65 may transfer the substrate(s) placed on the buffer slot 60 into the process chamber 50 while moving on the transfer rail 70.

In example embodiments, the apparatus for processing a substrate may include a plurality of process chambers 50. For example, the plurality of process chambers 50 may include, but not limited to, an etching chamber, a deposition chamber, a sputtering chamber, a coating chamber, a developing chamber, a cleaning chamber and a drying chamber in which various processes may be executed to manufacture an integrated circuit device including a semiconductor device or a display device including a flat panel display device.

In the process chambers 50, desired processes including the deposition process, the etching process, the sputtering process, the coating process, the developing process, the cleaning process and the drying process may be performed on the substrate(s). In this case, each of the process chambers 50 may have a door which can be opened and closed for loading and unloading the substrate.

Figure 2:
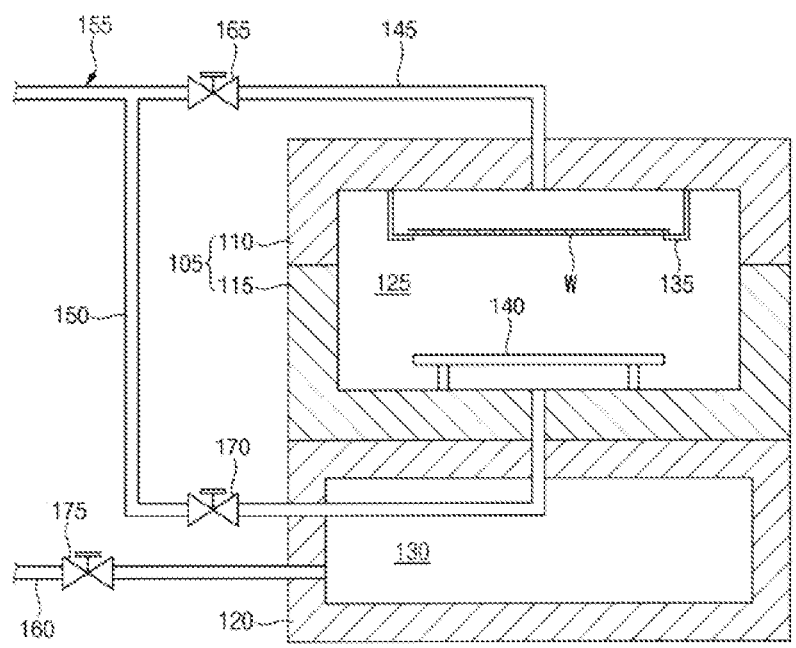
FIG. 2 is a cross-sectional view illustrating a process chamber and a supporting device in accordance with example embodiments of the invention.

FIG. 2 is a cross-sectional view illustrating a process chamber and a supporting device in accordance with example embodiments of the invention.

Referring to FIG. 2, the apparatus for processing a substrate may include a process chamber 105, a fluid supply unit, a control unit, a supporting device, etc. In example embodiments, the process chamber 105 of the apparatus for processing a substrate may be a drying chamber.

The supporting device may be disposed to be adjacent to the process chamber 105. The supporting device may include a supporting chamber 120 which can make contact with the process chamber 105. Additionally, the supporting device may include a supply member which can provide a predetermined fluid into the supporting chamber 120.

In example embodiments, the supporting chamber 120 may provide a supporting space therein. Although FIG. 2 illustrates the supporting chamber 120 disposed beneath the process chamber 105, the position of the supporting chamber 120 may vary in accordance with the structure and dimension of the process chamber 105, the configuration of the supply line, the process conditions of the processes executed in the process chamber 105, etc.

The process chamber 105 may include a first housing 110, a second housing 115, a supporting unit 135 and a blocking unit 140.

The first housing 110 may be combined with the second housing 115 and the first and the second housings 110 and 115 may provide a processing space 125 in which a drying process may be executed on a substrate W disposed in the process chamber 105. In example embodiments, the drying process may be performed by supplying a fluid in a supercritical state onto an upper face and a bottom face of the substrate W. For example, the fluid in the supercritical state may include a carbon dioxide gas in a supercritical state.

The supporting unit 135 of the process chamber 105 may support the substrate W in the processing space 215 provided by the first and the second housings 110 and 115. The supporting unit 135 may be installed in the first housing 110. For example, the supporting unit 135 may have a hook shaped structure downwardly extending from an inner wall of the first housing 110. In example embodiments, a plurality of supporting units 135 may be mounted on the inner wall of the first housing 110. The peripheral portion of the substrate W may be stably supported by the plurality of supporting units 135.

The fluid supply unit may provide the fluid in the supercritical state into the process chamber 105 and the supporting chamber 120. In example embodiments, the fluid supply unit may include a first supply line 155 which may include branch lines providing the fluid in the supercritical state into the process chamber 105. In this case, the supply member of the supporting device may include a second supply line 160 that may supply the fluid in the supercritical state into the supporting chamber 120.

The first supply line 155 may include a first branch line 145 and a second branch line 150. The first branch line 145 may be connected to the first housing 110 and the second branch line 150 may be connected to the second housing 115 through the supporting chamber 120. In example embodiments, the first branch line 145 may supply the fluid in the supercritical state into the processing space 125 through a first inlet port. Further, the second branch line 150 may provide the fluid in the supercritical state into the processing space 125 through a first connection port and a second connection port of the supporting chamber 120 and a second inlet port of the second housing 115.

The fluid in the supercritical state may be provided onto the substrate W from an upper portion of the processing space 125 through the first branch line 145 and the first inlet port of the first housing 110. In addition, the fluid in the supercritical state may be introduced into the processing space 125 through the second branch line 150, the first and the second connection ports of the supporting chamber 120 and the second inlet port of the second housing 115. In example embodiments, the first connection port may be provided on a side portion of the supporting chamber 120 and the second connection port may be provided on an upper portion of the supporting chamber 120. The second branch line 150 may pass through the first connection port, the supporting space 130 and the second connection port, and then may be connected to the second inlet port of the second housing 115.

The first branch line 145 may include a first control valve 165 and the second branch line 150 may include a second control valve 170. Each of the first control valve 165 and the second control valve 170 may adjust a flow rate of the fluid in the supercritical state supplied into the processing space 125, and also may adjust a first pressure generated by the fluid in the supercritical state in the processing space 125. In this case, the first control valve 165 and the second control valve 170 may simultaneously or sequentially adjust the flow rate of the fluid in the supercritical state and the first pressure in the processing space 125.

The blocking unit 140 may be disposed over the second inlet port of the second housing 115. For example, the blocking unit 140 may substantially cover the second inlet port of the second housing 115. The blocking unit 140 may prevent the fluid in the supercritical state from directly contacting the substrate W.

As illustrated in FIG. 2, the second supply line 160 of the supporting device may supply the fluid in the supercritical state into the supporting space 120. The second supply line 160 may be connected to a third inlet port of the supporting chamber 120. Here, the third inlet port may be provided on a side portion of the supporting chamber 120.

The second supply line 160 may include a third control valve 175. The third control valve 175 may adjust a flow rate of the fluid in the supercritical state provided into the supporting space 130. Further, the third control valve 175 may adjust a second pressure generated by the fluid in the supercritical state in the supporting space 130. In example embodiments, the second pressure in the supporting space 130 may be substantially equal to or substantially greater than the first pressure in the processing space 125. Therefore, the stability and the durability of the process chamber 105 may be enhanced by the supporting chamber 120 having a higher second pressure.

When the fluid in the supercritical state is introduced into the process chamber 125, the components included in the process chamber 105 may be deformed or damaged by means of the first pressure caused by the fluid in the supercritical state. For example, the components of the process chamber 105 may be twisted, bent, or cracked by the relatively high first pressure generated in the process chamber 105. Therefore, the structural stability and the durability of the process chamber 105 may be reduced. Additionally, the reliability of the process performed on the substrate W in such process chamber 105 may be simultaneously deteriorated. In contrast, according to example embodiments, the supporting device including the supporting chamber 120 and the supply member with a relatively simple configuration may effectively prevent the components of the process chamber 105 from being deformed or damaged. In other words, since the second pressure generated by the fluid in the supercritical state in the supporting space 130 may be substantially equal to or greater than the first pressure in the processing space 125, the supporting device having the second pressure may effectively prevent the components included in the process chamber 105 having the first pressure from being deformed, damaged, or cracked. Accordingly, the structural stability and the durability of the process chamber 105 may be enhanced. Further, the reliability of the process executed in the process chamber 105 having the enhanced stability and durability may be improved. As a result, the integrated circuit device including the semiconductor device or the display device including the flat panel display device may have improved reliability while reducing the cost for manufacturing the integrated circuit device or the display device using the apparatus for processing a substrate.

Figure 3:
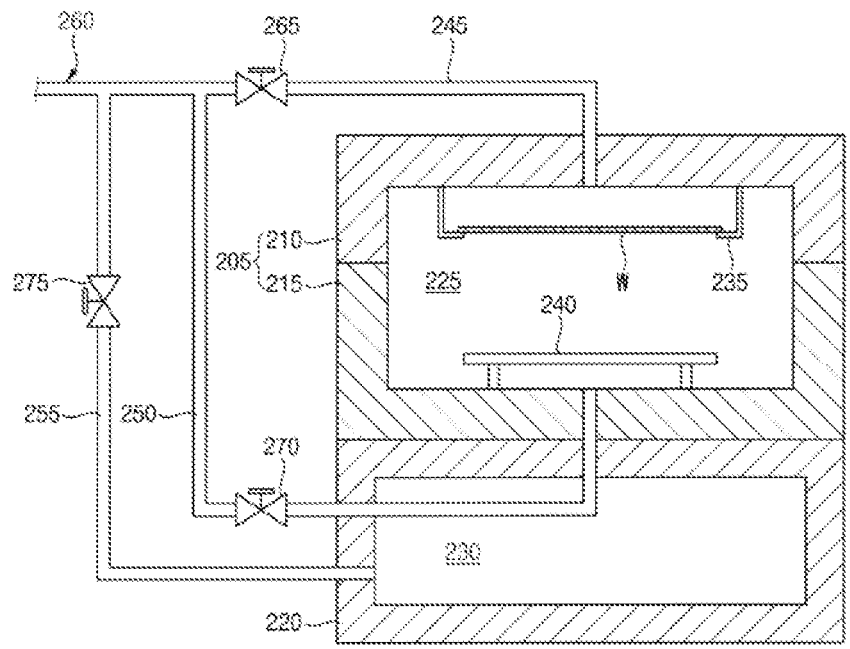
FIG. 3 is a cross-sectional view illustrating a process chamber and a supporting device in accordance with some example embodiments of the invention.

FIG. 3 is a cross-sectional view illustrating a process chamber and a supporting device in accordance with some example embodiments of the invention.

Referring to FIG. 3, the apparatus for processing a substrate may include a process chamber 205, a fluid supply unit, a control unit, a supporting device, etc. The supporting device may be adjacent to the process chamber 205, and may include a supporting chamber 220 which may provide a supporting space 230 therein. In addition, the supporting device may include a supply member which may provide a fluid into the supporting space 230.

The process chamber 205 may include a first housing 210, a second housing 215, a supporting unit 235 and a blocking unit 240. The first housing 210 and the second housing 215 may be combined each other, and a processing space 225 may be provided in the process chamber 225.

The supporting unit 235 of the process chamber 205 may hold a substrate W in the processing space 225 provided by the first and the second housings 210 and 215. The supporting unit 235 may be installed in the first housing 210. For example, a plurality of supporting units 235 may be installed in the first housing 210 to support a peripheral portion of the substrate W.

The fluid supply unit may provide a fluid in a supercritical state into the process chamber 205 and the supporting chamber 220. In some example embodiments, the fluid supply unit may include a supply line 260, a first branch line 245, a second branch line 250 and a third branch line 255. Each of the first branch line 245, the second branch line 250 and the third branch line 255 may be divided from the supply line 260 to thereby supply the fluid in the supercritical state into the process chamber 205 and the supporting chamber 220. In this case, the supply member of the supporting device may be the third branch line 255 which may provide the fluid in the supercritical state into the supporting chamber 220.

The first branch line 245 may be connected to the first housing 210 and the second branch line 250 may be connected to the second housing 215. In some example embodiments, the fluid in the supercritical state may be supplied from the first branch line 245 into the processing space 225 through a first inlet port of the first housing 210. Further, the fluid in the supercritical state may be provided from the second branch line 250 into the processing space 225 through a first connection port and a second connection port of the supporting chamber 220 and a second inlet port of the second housing 215. Moreover, the fluid in the supercritical state may be introduced from the third branch line 255 into the supporting space 230 through a third inlet port which may be provided on a side portion of the supporting chamber 220.

In other example embodiments, the first connection port may be provided on the side portion of the supporting chamber 220 and the second connection port may be provided on an upper portion of the supporting chamber 220. The second branch line 250 may pass through the first connection port, the supporting space 230 and the second connection port, and then may be connected to the second inlet port of the second housing 215.

The blocking unit 240 may be disposed over the second inlet port of the second housing 215. The blocking unit 240 may prevent the substrate W from directly contacting the fluid in the supercritical state.

As illustrated in FIG. 3, the first branch line 245 may include a first control valve 265, the second branch line 250 may include a second control valve 270, and the third branch line 255 may include a third control valve 275. The first control valve 265 and the second control valve 270 may adjust flow rates of the fluid in the supercritical state provided into the processing space 225, and also may adjust a first pressure generated by the fluid in the supercritical state in the processing space 225. The third branch line 255 of the supporting device may supply the fluid in the supercritical state into the supporting space 230. Here, the third branch line 255 may be connected to the third inlet port of the supporting chamber 220. The third control valve 275 may adjust a flow rate of the fluid in the supercritical state provided into the supporting space 230 and may adjust a second pressure generated by the fluid in the supercritical state in the supporting space 230. In this case, the second pressure in the supporting space 230 may be substantially equal to or substantially higher than the first pressure in the processing space 225 such that the stability and the durability of the process chamber 205 may be enhanced by the supporting chamber 220 having the relatively greater second pressure as described above. As a result, the integrated circuit device including the semiconductor device or the display device including the flat panel display device may have improved reliability while reducing the cost for manufacturing the integrated circuit device and the display device using the apparatus for processing a substrate. According to some example embodiments, the apparatus for processing a substrate may have a simple configuration without an additional fluid supply source since the third branch line 255 of the supporting device may be divided from the supply line 260.

Figure 4:
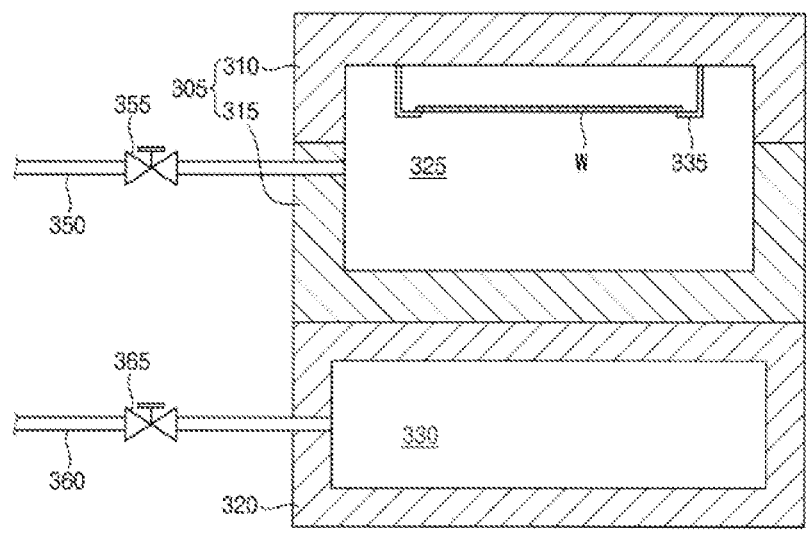
FIG. 4 is a cross-sectional view illustrating a process chamber and a supporting device in accordance with other example embodiments of the invention.

FIG. 4 is a cross-sectional view illustrating a process chamber and a supporting device in accordance with other example embodiments of the invention.

Referring to FIG. 4, the apparatus for processing a substrate may include a process chamber 305, a fluid supply unit, a control unit, a supporting device, etc. The supporting device may include a supporting chamber 320 capable of providing a supporting space 330 therein and a supply member capable of providing a fluid into the supporting chamber 320.

The process chamber 305 may include a first housing 310, a second housing 315 and a supporting unit 335 without a separate blocking unit. The first housing 310 may be combined with the second housing 315 to provide a processing space 325 in the process chamber 305. The supporting unit 335 may be disposed in the first housing 310 and may support a substrate W in the processing space 325.

The fluid supply unit may supply a fluid in a supercritical state into the process chamber 305 and the supporting chamber 320. In other example embodiments, the fluid supply unit may include a first supply line 350 and a second supply line 360. The first supply line 350 may provide the fluid in the supercritical state into the processing space 325 and the second supply line 360 may provide the fluid in the supercritical state into the supporting space 330. Here, the supply member of the supporting device may be the second supply line 360 which may provide the fluid in the supercritical state into the supporting chamber 360.

The first supply line 350 may be connected to a first inlet port of the second housing 315 and the second supply line 355 may be connected to a second inlet port of the supporting chamber 320. In this case, the first inlet port may be provided on a side portion of the second housing 315 and the second inlet port may be provided on a side portion of the supporting chamber 320. Although FIG. 4 illustrates the first inlet port installed on the side portion of the second housing 315, the first inlet port may be provided on a side of the first housing 310.

The first supply line 350 may include a first control valve 355 and the second supply line 360 may include a second control valve 365. The first control valve 355 may adjust a flow rate of the fluid in the supercritical state supplied into the processing space 325 and may adjust a first pressure generated by the fluid in the supercritical state in the processing space 325. The second control valve 365 may adjust a flow rate of the fluid in the supercritical state provided into the supporting space 330 and may adjust a second pressure generated by the fluid in the supercritical state in the supporting space 330. Here, the second pressure in the supporting space 330 may be substantially equal to or substantially greater than the first pressure in the processing space 325.

Figure 5:
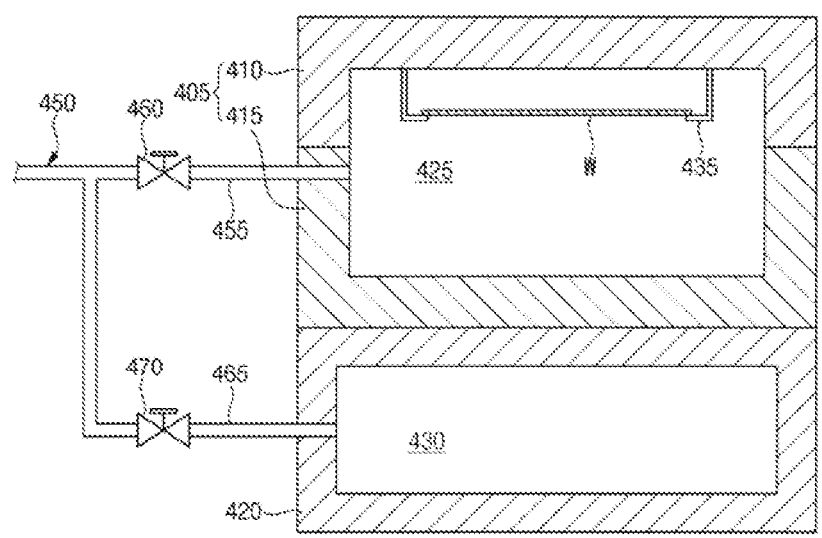
FIG. 5 is a cross-sectional view illustrating a process chamber and a supporting device in accordance with still other example embodiments of the invention.

FIG. 5 is a cross-sectional view illustrating a process chamber and a supporting device in accordance with still other example embodiments of the invention.

Referring to FIG. 5, the apparatus for processing a substrate may include a process chamber 405, a fluid supply unit, a control unit, a supporting device, etc. The supporting device may include a supporting chamber 420 capable of providing a supporting space 430 therein and a supply member capable of providing a fluid into the supporting chamber 420.

The process chamber 405 may include a first housing 410, a second housing 415 and a supporting unit 435 without an additional blocking unit. The first housing 410 and the second housing 415 may be combined each other to provide a processing space 425 in the process chamber 405. The supporting unit 435 may be installed in the first housing 410 and may support a substrate W in the processing space 425.

The fluid supply unit may supply a fluid in a supercritical state into the process chamber 405 and the supporting chamber 420. In other example embodiments, the fluid supply unit may include supply line 450, a first branch line 455 and a second branch line 465. Each of the first branch line 465 may be divided from the supply line 450. The first branch line 465 may provide the fluid in the supercritical state into the processing space 425 and the second branch line 465 may provide the fluid in the supercritical state into the supporting space 430. Here, the supply member of the supporting device may be the second branch line 465.

The first branch line 455 may be connected to a first inlet port of the second housing 415 and the second branch line 465 may be connected to a second inlet port of the supporting chamber 420. For example, the first inlet port may be provided on a side portion of the second housing 415 and the second inlet port may be provided on a side portion of the supporting chamber 420. Alternatively, the first inlet port may be installed on a side of the first housing 410.

The first branch line 455 may include a first control valve 460 and the second branch line 465 may include a second control valve 470. The first control valve 460 may adjust a flow rate of the fluid in the supercritical state provided into the processing space 425, and may adjust a first pressure generated by the fluid in the supercritical state in the processing space 425. The second control valve 470 may adjust a flow rate of the fluid in the supercritical state provided into the supporting space 430 and may adjust a second pressure generated by the fluid in the supercritical state in the supporting space 430. Here, the second pressure in the supporting space 430 may be substantially equal to or substantially higher than the first pressure in the processing space 425, and thus the stability and the durability of the process chamber 405 may be enhanced by the supporting chamber 420 having the relatively greater second pressure as described above.

According to example embodiments of the invention, an apparatus for processing a substrate may include a supporting device for supporting a process chamber such that the supporting device may effectively prevent components included in the process chamber from being deformed, damaged, or cracked by means of a high pressure generated by a fluid in a supercritical state introduced in the process chamber. Therefore, the structural stability and the durability of the process chamber may be enhanced, and the reliability of the process executed in the process chamber may be improved. As a result, while reducing the cost for manufacturing an integrated circuit device including a semiconductor device or a display device including a flat panel display device using the apparatus for processing a substrate, the integrated circuit device or the display device may have improved reliability.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A substrate processing system, comprising:
   a process chamber for processing a substrate, the process chamber including a supporting unit for supporting the substrate;
   a supporting chamber that is arranged to support the process chamber;
   a first supply line including a first branch line and a second branch line to supply a fluid in a supercritical state into the process chamber, the first branch line being connected to an upper portion of the process chamber, the second branch line passing through an interior space of the supporting chamber, the second branch line being connected to a lower portion of the process chamber via a connection port that is formed in a wall of the supporting chamber and an inlet port that is formed in a wall of the process chamber, wherein the wall of the process chamber faces and contacts the wall of the supporting chamber;
   a second supply line to supply the fluid in the supercritical state into the interior space of the supporting chamber, so as to increase stability of the process chamber by adjusting a pressure generated by the fluid in the supercritical state in the interior space of the supporting chamber, wherein the second supply line is separate from the first supply line; and
   a blocking unit that is disposed in the process chamber over the inlet port, the blocking unit being configured to prevent the fluid in the supercritical state from directly contacting the substrate,
   wherein out of the process chamber and the supporting chamber, only the process chamber is arranged to process a substrate.

2. The substrate processing system of claim 1, wherein the first branch line includes a first control valve for adjusting a flow rate of the fluid in the supercritical state, and the second branch line includes a second control valve for adjusting a flow rate of the fluid in the supercritical state.

3. The substrate processing system of claim 1, wherein the connection port in the wall of the supporting chamber is aligned with the inlet port in the wall of the process chamber.

4. The substrate processing system of claim 1, wherein the second supply line includes a supporting valve that is arranged to control a flow of the fluid into the interior space of the supporting chamber and maintain a pressure in the supporting chamber that is greater than or equal to a pressure in the process chamber.

5. The substrate processing system of claim 1, wherein the connection port is formed in an upper portion of the supporting chamber in the wall of the supporting chamber.

6. The substrate processing system of claim 1, further comprising a plurality of supporting units mounted on an inner wall of the process chamber.

7. The substrate processing system of claim 6, wherein each of the plurality of supporting units comprises two or more hook shaped structures downwardly extending from the inner wall of the process chamber.

8. The substrate processing system of claim 1, wherein the fluid in the supercritical state includes a carbon dioxide gas in a supercritical state.

9. An system for processing a substrate comprising:
   a process chamber providing a processing space in which a predetermined process is performed on the substrate;

a supporting chamber for supporting the process chamber;

a first supply line including a first branch line and a second branch line to supply a fluid in a supercritical state into the process chamber, the first branch line being connected to an upper portion of the process chamber, the second branch line passing through an interior space of the supporting chamber, the second branch line being connected to a lower portion of the process chamber via a connection port that is formed in a wall of the supporting chamber and an inlet port that is formed in a wall of the process chamber, wherein the wall of the process chamber faces and contacts the wall of the supporting chamber;

a second supply line to supply the fluid in the supercritical state into the interior space of the supporting chamber, so as to increase stability of the process chamber by adjusting a pressure generated by the fluid in the supercritical state in the interior space of the supporting chamber; and a blocking unit that is disposed in the process chamber over the inlet port, the blocking unit being configured to prevent the fluid in the supercritical state from directly contacting the substrate, wherein the second supply line is separate from the first supply line.

10. The system of claim 9, wherein the connection port in the wall of the supporting chamber is aligned with the inlet port in the wall of the process chamber.

11. The system of claim 9, wherein the second supply line includes a supporting valve that is arranged to control a flow of the fluid into the interior space of the supporting chamber and maintain a pressure in the supporting chamber that is greater than or equal to a pressure in the process chamber.

12. The system of claim 9, wherein the connection port is formed in an upper portion of the supporting chamber in the wall of the supporting chamber.

13. The system of claim 9, wherein the process chamber further comprises a plurality of supporting units for supporting the substrate mounted on an inner wall of the process chamber.

14. The system of claim 13, wherein each of the plurality of supporting units comprises two or more hook shaped structures downwardly extending from the inner wall of the process chamber.

15. The system of claim 9, wherein the fluid in the supercritical state includes a carbon dioxide gas in a supercritical state.

* * * * *